United States Patent [19]
Tsumura

[11] Patent Number: 5,977,839
[45] Date of Patent: Nov. 2, 1999

[54] COMPENSATED FREQUENCY SOURCE WITH LATCHED TEMPERATURE COMPENSATION, AND METHOD FOR IT'S CONTROL

[75] Inventor: Soichi Tsumura, Tokyo, Japan

[73] Assignee: NEC Corporation, Tokyo, Japan

[21] Appl. No.: 08/979,737

[22] Filed: Nov. 25, 1997

[30] Foreign Application Priority Data

Nov. 28, 1996 [JP] Japan ..................................... 8-317544

[51] Int. Cl.$^6$ ............................... H03B 5/04; H03B 5/32; H03L 1/02; H03L 7/00
[52] U.S. Cl. .......................... 331/66; 331/36 C; 331/158; 331/177 V; 310/315; 310/318
[58] Field of Search ..................................... 331/36 C, 66, 331/116 R, 116 FE, 117 R, 117 FE, 117 D, 158, 176, 177 V; 310/315, 318

[56] References Cited

U.S. PATENT DOCUMENTS

| | | | |
|---|---|---|---|
| 4,633,422 | 12/1986 | Brauer | 331/176 X |
| 5,126,699 | 6/1992 | Kabler | 332/124 |
| 5,760,656 | 6/1998 | Sutliff et al. | 331/116 R |

FOREIGN PATENT DOCUMENTS

| | | |
|---|---|---|
| 2-5605 | 1/1990 | Japan . |
| 7-245563 | 9/1995 | Japan . |
| 8-79145 | 3/1996 | Japan . |

*Primary Examiner*—David Mis

[57] ABSTRACT

A digital temperature compensation oscillator by which its AFC operation to a receive signal cannot be disturbed by temperature compensation operation. A digital temperature compensation oscillator comprises a temperature sensor, an address creating section, a ROM, latching means, and a voltage-controlled crystal oscillator. The temperature sensor produces an output signal varied according to ambient temperatures. The address creating section converts an output from the temperature sensor into a signal and then creating it as a ROM (read-only memory) address. The ROM stores a control voltage to compensate a frequency variation due to ambient temperatures of a voltage-controlled crystal oscillator. The latching means holds or passes data output from the ROM according to an external control signal. The D/A converter produces a control voltage for the voltage-controlled crystal oscillator according to the latching means. The voltage controlled crystal oscillator is fine adjusted based on two control voltages including the output signal from the D/A converter and an external analog AFC signal.

13 Claims, 4 Drawing Sheets

COMPENSATED FREQUENCY SOURCE WITH LATCHED TEMPERATURE COMPENSATION, AND METHOD FOR IT'S CONTROL

BACKGROUND OF THE INVENTION

The present invention relates to an arrangement of a reference frequency oscillation source, which is used in a base station with high frequency precision and terminals for radio communications, capable of reducing variations in oscillation frequency due to its temperature changes or secular changes. The present invention also relates to a method for controlling the novel arrangement.

The oscillation frequency of a crystal oscillator is decided by the inherent frequency of the piezoelectric crystal resonator contained therein. The piezoelectric crystal has its stable inherent oscillation frequency and can advantageously provide a stable oscillator. This crystal element is particularly used as a time or frequency reference source in radio communications apparatuses.

In recent years, large capacity communication systems have been developed to respond to an increasing number of users of radio communications typically including cellular telephones. Such large capacity communication systems require oscillators with a frequency error of, for example, less than 1 ppm. There are strong demands for time or frequency reference sources with higher precision. Particularly, the direct sequence code division multiple access (DS-CDMA) system that basically adds receive signals in phase is used to realize excellent noise-resistance and anti-interference. However, an error in frequency between a transmitter and a receiver causes the addition in phase to fail, thus resulting in remarkable characteristic degradation. In general, the temperature compensation crystal oscillator (TCXO) for a frequency standard using a simple analog technique can realize a frequency precision of about 3 ppm. However, in the case of the DS-CDMA system, since the noise-resistance and anti-interference characteristics can be advantageously improved by increasing the number of symbols added in phase, the frequency reference with a high precision of less than 1 ppm is sometimes needed. In that case, the temperature compensation in an analog fashion leads to a complicated circuit configuration, thus increasing the manufacturing costs and the space for assembly. To solve such problems, JP-A 5605/1990, for example, discloses the method of storing data compensating the temperature characteristic indicating a frequency change to a frequency control signal of a crystal oscillator into a ROM, instead of a simple temperature compensation in an analog fashion, and then performing the digital temperature compensation based on the temperature measured with a temperature sensor.

FIG. 3 illustrate the configuration of the conventional digital temperature compensation crystal oscillator disclosed in JP-A 5605/1990. Referring to FIG. 3, a temperature sensor 1 measures the ambient temperature of the voltage controlled crystal oscillator 9. An address creating unit 2 creates an address at which corresponding compensation data is stored. A read-only memory (ROM) 3 previously stores compensation data over the entire temperature range for each crystal oscillator and outputs the compensation data for an address designated by the address creating unit. Successively, the D/A converter converts compensation data output from the ROM 3 into an analog signal. The resonator circuit 7 is controlled with the analog signal to compensate the oscillation frequency of the oscillator 8. Finally, the oscillator 8 outputs the reference frequency signal 800. The prior art publication further discloses the method of compensating the oscillation frequency by means of plural pairs of an analog switch and a capacitor, without using the D/A converter 6. The detail is not described here.

On the other hand, the automatic frequency control (AFC) is listed as a method of compensating errors in frequency between a transmitter and a receiver using the receive signal on the receiver side. There are various AFC methods. The JP-A 79145/1996, for example, discloses the frequency compensating method using two receiving systems. One desired wave extracting filter is just set to the signal band to be received while the other desired wave extracting filter is set to a broader band containing a variation in center frequency due to a frequency error between the transmitter and a receiver plus the signal band to be received. Thus, by preventing the attenuation of a receive signal power due to the desired wave extracting filter at the presence of a frequency error, the frequency pulling operation can be performed under the AFC even if the frequency error is large.

Moreover, JP-A 245563/1995 discloses another frequency compensating method. According to this method, the frequency offset data for several patterns stored in a ROM are swept on trial at the time of starting the AFC while a frequency error between a transmitter and a receiver is measured. Trial and error is repeated with various types of frequency offset data until the frequency error falls finally within the range in which the normal AFC operation can be executed.

The configuration disclosed in JP-A 5605/1990 performs only the step of compensating oscillation frequency variations due to temperature changes. Since the frequency error between a transmitter and a receiver has a relative value, the transmitter side with a frequency precision may sometimes need AFC to compensate the frequency error therebetween.

In the DS-CDMA system, the receiving operation is started with a certain frequency error (e.g. less than 1 ppm) between a transmitter and a receiver. Then, the relative error to the frequency of the transmitter must be controlled to a smaller value (e.g. less than 0.1 ppm) by performing the AFC operation using the receive signal received by a receiver.

On the condition that the frequency precision of a transmitter is so high that the frequency error can be ignored to an actual frequency, there is no problem if the frequency compensation of the configuration disclosed in JP-A 5605/1990 can improve the frequency precision of a receiver so as to ignore the frequency error to the actual frequency. However, it is difficult to actually satisfy such a condition because the amount of compensation data stored into the ROM 3 increases and the precision of the temperature sensor 1 is insufficient.

Even if the compensation of a variation in oscillation frequency due to temperature changes is merely combined with the AFC operation by a receive signal, the oscillation frequency varied due to ambient temperature changes is compensated during the AFC operation by the receive signal. As a result, the high precision frequency compensation under the AFC by the receive signal may be carried out in vain.

In addition, the frequency variation due to aging may cause a frequency error when the frequency variation caused by a temperature change is compensated with a preset compensation value, so that the receiving operation cannot be performed under the worst conditions.

According to, the configuration disclosed in, for example, JP-A 79145/1996, when there is a frequency error between a transmitter and a receiver, the desired wave extracting filter with the filtering characteristics fully matched to the band of a signal to be received attenuates its output. The output of the desired wave extracting filter with a slightly broader band contains undesired band noise components. Hence, the S/N ratio of the configuration is deteriorated. Moreover, in the DS-CDMA system, when the frequency error is large to some extent, the receive signal cannot be demodulated, so that even the AFC control cannot be performed.

According to JP-A 245563/1995, the configuration decides on trial the compensation amount for a frequency error without using information from the temperature sensor. Hence, a long period of time is taken to begin the frequency pulling operation under the AFC operation.

SUMMARY OF THE INVENTION

The objective of the present invention is to solve the above-mentioned tasks.

Moreover, the objective of the invention is to provide a digital temperature compensation oscillator capable of pre-setting its frequency error within a predetermined range before a receiving operation to perform AFC with a receive signal and capable of controlling its frequency under only AFC after the AFC operation, whereby frequency variations due to aging can be absorbed.

The another objective of the present invention is to provide a method for controlling a digital temperature compensation oscillator that can preset its frequency error within a predetermined range before a receiving operation to perform AFC with a receive signal and can control its frequency under only AFC after the AFC operation, whereby frequency variations due to aging can be absorbed.

The objective of the present invention is achieved by a digital temperature compensation oscillator in a reference frequency source used in a base station with high frequency precision and terminals for radio communications, comprising a temperature sensor for producing an output signal varied according to ambient temperatures, an address creating unit for converting an output from the temperature sensor into a signal and then creating it as a ROM (read-only memory) address, a voltage-controlled crystal oscillator, a ROM for storing a control voltage to compensate a frequency variation due to ambient temperatures of the voltage-controlled crystal oscillator, latching means for holding or passing data output from the ROM according to an external control signal, and a D/A converter for producing a control voltage for the voltage-controlled crystal oscillator according to the latching means, the voltage controlled crystal oscillator being fine adjusted based on two control voltages including the output signal from the D/A converter and an external analog AFC signal.

Moreover, according to the present invention, a digital temperature compensation oscillator in a reference frequency source used in a base station with high frequency precision and terminals for radio communications, comprises a temperature sensor for producing an output signal varied according to ambient temperatures, an address creating unit for converting an output from the temperature sensor into a signal and then creating it as a ROM (read-only memory) address, a voltage-controlled crystal oscillator, a ROM for storing a control voltage to compensate a frequency variation due to ambient temperatures of the voltage-controlled crystal oscillator, first latching means for holding or passing data output from the ROM according to an external control signal and second latching means for holding or passing an external AFC signal according to an external control signal, an adder for adding the output of the ROM held in or passed through the first latching means to the digital AFC signal and held in or passed through the second latching means, and a D/A converter for producing a control voltage for the voltage controlled crystal oscillator according to the output from the adder, the voltage controlled crystal oscillator being fine adjusted based on one control voltage.

In the digital temperature compensation oscillator according to the present invention, the oscillation frequency of the voltage-controlled crystal oscillator is adjusted by fixing an external analog AFC signal to a predetermined default value in the initial state when power is turned on, compensating a variation in oscillation frequency due to temperature changes of the voltage-controlled crystal oscillator with only the output of the D/A converter, holding the output of the ROM by means of the latching means when precision frequency synchronization is performed using a receive signal from the base station, and varying said external analog AFC signal in accordance with the frequency synchronous operation.

In the digital temperature compensation oscillator according to the present invention, the oscillation frequency of the voltage-controlled crystal oscillator is adjusted by fixing only the external digital AFC signal to a predetermined default value in the initial state when power is turned on, adding the default value to the output of the ROM read out in accordance with ambient temperatures by means of the adder, compensating a variation in oscillation frequency due to temperature changes of the voltage-controlled crystal oscillator with only the output of the D/A converter, holding only the output of the ROM by means of the latching means when precision frequency synchronization is performed using a receive signal from the base station, and varying the external digital AFC signal in accordance with the frequency synchronous operation.

In the digital temperature compensation oscillator according to the present invention, a value determined by the value of an AFC signal just after precise frequency synchronization has been executed to the base station in the previous use is used as a default value of the analog or digital AFC signal.

Furthermore, according to the present invention, in a method for controlling a digital temperature compensation oscillator in a reference frequency source used in a base station with high frequency precision and terminals for radio communications, the digital temperature compensation oscillator including a ROM, latching means, a D/A converter, and a voltage-controlled crystal oscillator, the method comprises the steps of producing an output signal varied according to ambient temperatures of the voltage-controlled crystal oscillator, converting the output signal into a ROM (read-only memory) address, storing a control voltage into the ROM to compensate a frequency variation due to ambient temperatures of the voltage-controlled crystal oscillator, holding or passing data output from the ROM according to an external control signal, producing a control voltage for the voltage-controlled crystal oscillator according to the data output from the ROM, and fine adjusting the voltage-controlled crystal oscillator based on two control voltages including the control voltage and an external analog AFC signal.

According to the present invention, in a method for controlling a digital temperature compensation oscillator in a reference frequency source used in a base station with high frequency precision and terminals for radio communications, the digital temperature compensation oscillator including a ROM, latching means, an adder, a D/A converter, and a voltage-controlled crystal oscillator, the method comprises the steps of producing an output signal varied according to ambient temperatures of the voltage-controlled crystal oscillator, converting an output signal into a ROM (read-only memory) address, storing a control voltage to compensate a frequency variation due to ambient temperatures of the voltage-controlled crystal oscillator, holding or passing data output from the ROM according to an external control signal and an external AFC signal according to an external control signal, adding the output of the ROM to the digital AFC signal, producing a control voltage for the voltage controlled crystal oscillator according to the output obtained in the adding step, and fine adjusting the voltage controlled crystal oscillator based on one control voltage.

In the method according to the present invention, the fine adjusting step comprises the steps of fixing an external analog AFC signal to a predetermined default value in the initial state when power is turned on, compensating a variation in oscillation frequency due to temperature changes of the voltage-controlled crystal oscillator with only the output of the D/A converter, holding the output of the ROM by means of the latching means when precision frequency synchronization is performed using a receive signal from the base station, and varying the external analog AFC signal in accordance with the frequency synchronous operation.

BRIEF DESCRIPTION OF THE DRAWINGS

This and other objects, features and advantages of the present invention will become more apparent upon a reading of the following detailed description and drawings, in which.

DESCRIPTION OF THE EMBODIMENTS

Figure 1:
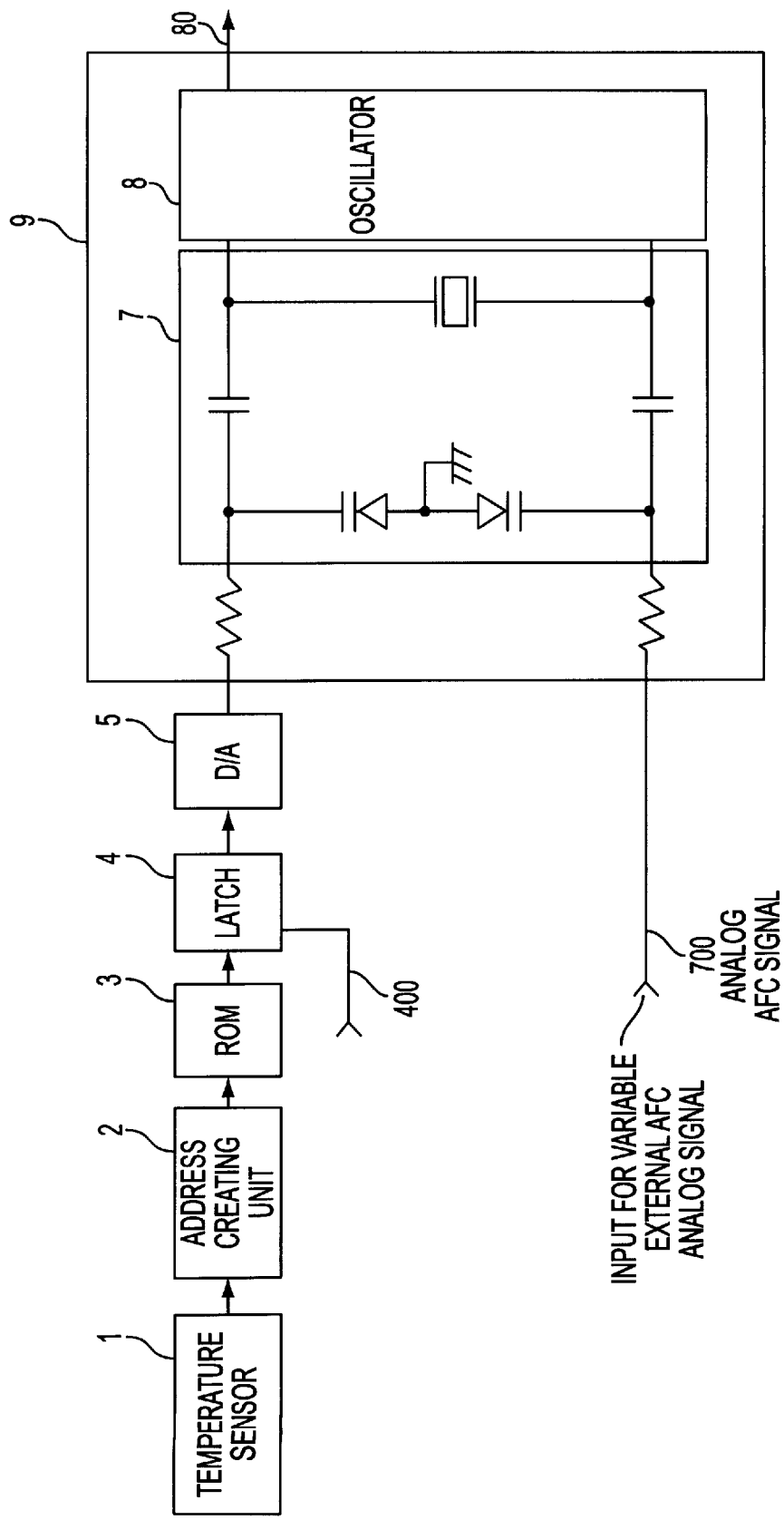
FIG. 1 is a block diagram showing a digital temperature compensation oscillator according to a first embodiment of the present invention.

In the digital temperature compensation oscillator according to the present invention shown in FIG. 1, the temperature sensor 1 outputs an output signal according to ambient temperatures. The address creating unit 2 converts the output signal into an address in the ROM 3 storing the temperature compensation data. The ROM 3 stores frequency compensation data according to the temperature previously indicated by the temperature sensor 1 into the address created by the address creating unit 2. The latching means 4 holds or passes the output from the ROM 3 according to the latch control signal 400 and then outputs it to the D/A converter 6. The D/A converter 6 controls the frequency of the voltage controlled crystal oscillator 9 according to the input signal. The voltage controlled crystal oscillator 9 also controls its frequency with the analog AFC signal 700.

In the initial state just after a power source is turned on, the external analog AFC signal 700 is fixed to a predetermined default value (to be described later). Data stored in the ROM 3 corresponds to data for compensating the frequency variations due to temperature changes while the default value of the analog AFC signal is input to the voltage controlled crystal oscillator 9. The ROM 3 is controlled by means of the temperature sensor 1 and the address creating unit 2. The D/A converter 6 converts the output from the ROM 3 into an analog signal. Changes in oscillation frequency due to temperature changes of the voltage controlled crystal oscillator 9 is compensated by the analog signal. This compensation operation allows the frequency error to the receive signal to be minimized to the extent that the AFC can be performed by the receive signal.

Next, in order to perform a precise frequency synchronous operation using the receive signal from the base station, the latching means 4 controlled by the latch control signal 400 holds the output from the ROM 3. This holding operation ceases the compensating operation which deals with temperature changes. The oscillation frequency of the voltage controlled crystal oscillator 9 is then adjusted by changing the external analog AFC signal 700 in synchronism with the frequency of the receive signal. In the conventional approach, if the ambient temperature changes during an AFC operation by the receive signal, the high precision frequency compensation under AFC becomes uselessly. However, the present invention can avoid the above-mentioned problem because the latching means 4 holds frequency compensation data for temperature compensation even if the ambient temperature changes after the beginning of an AFC operation by the receive signal.

Moreover, the latching means 4 holds the output from the ROM 3. The AFC operation is started according to the receive signal. The value of an analog AFC signal 700 is externally input in the initial state just after the power-up at the next time and then calculated using a value (not shown) decided by the analog AFC signal 700 obtained just after the frequency error is compensated to the extent of a necessary precision. The use of the resultant value allows the influence due to aging to be reduced.

Figure 2:
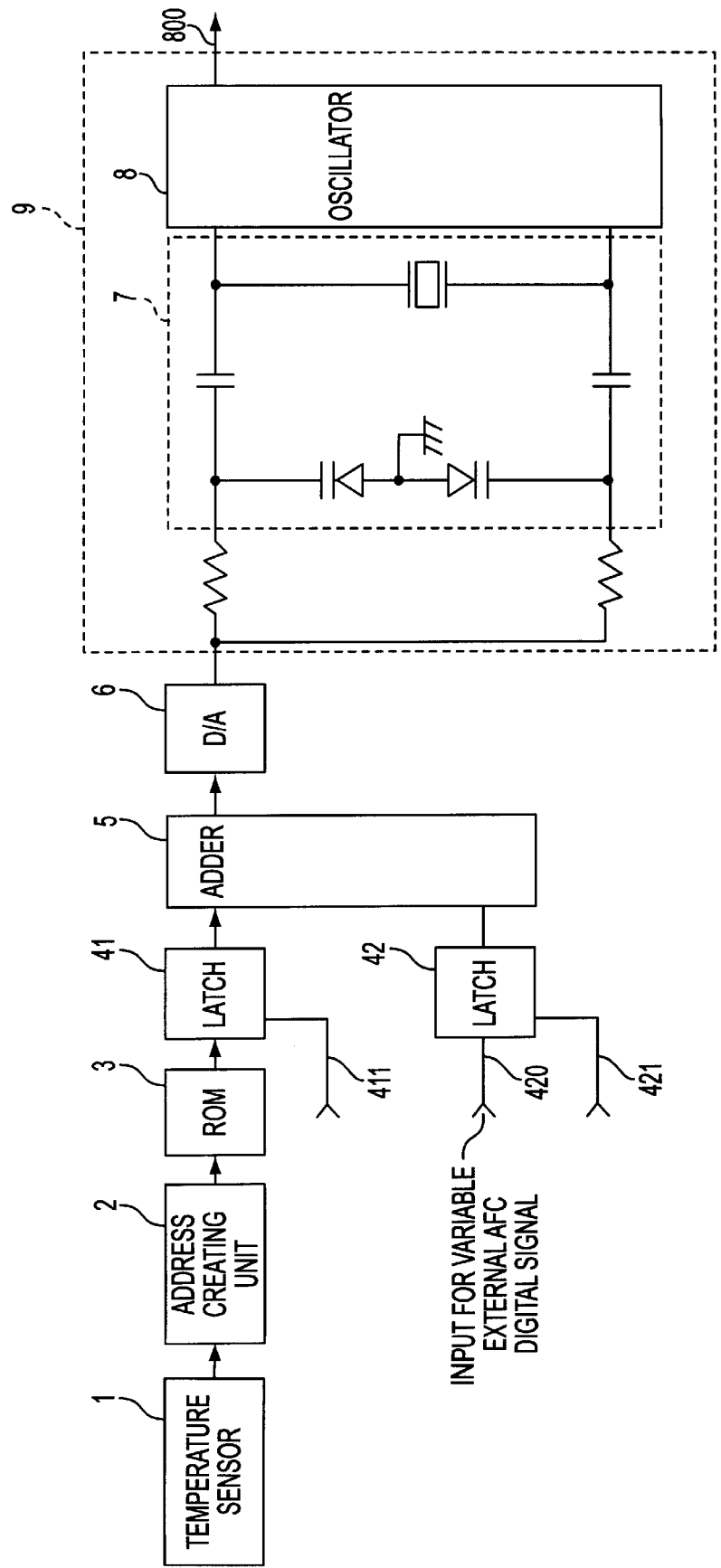
FIG. 2 is a block diagram showing a digital temperature compensation oscillator according to a second embodiment of the present invention.
Figure 3:
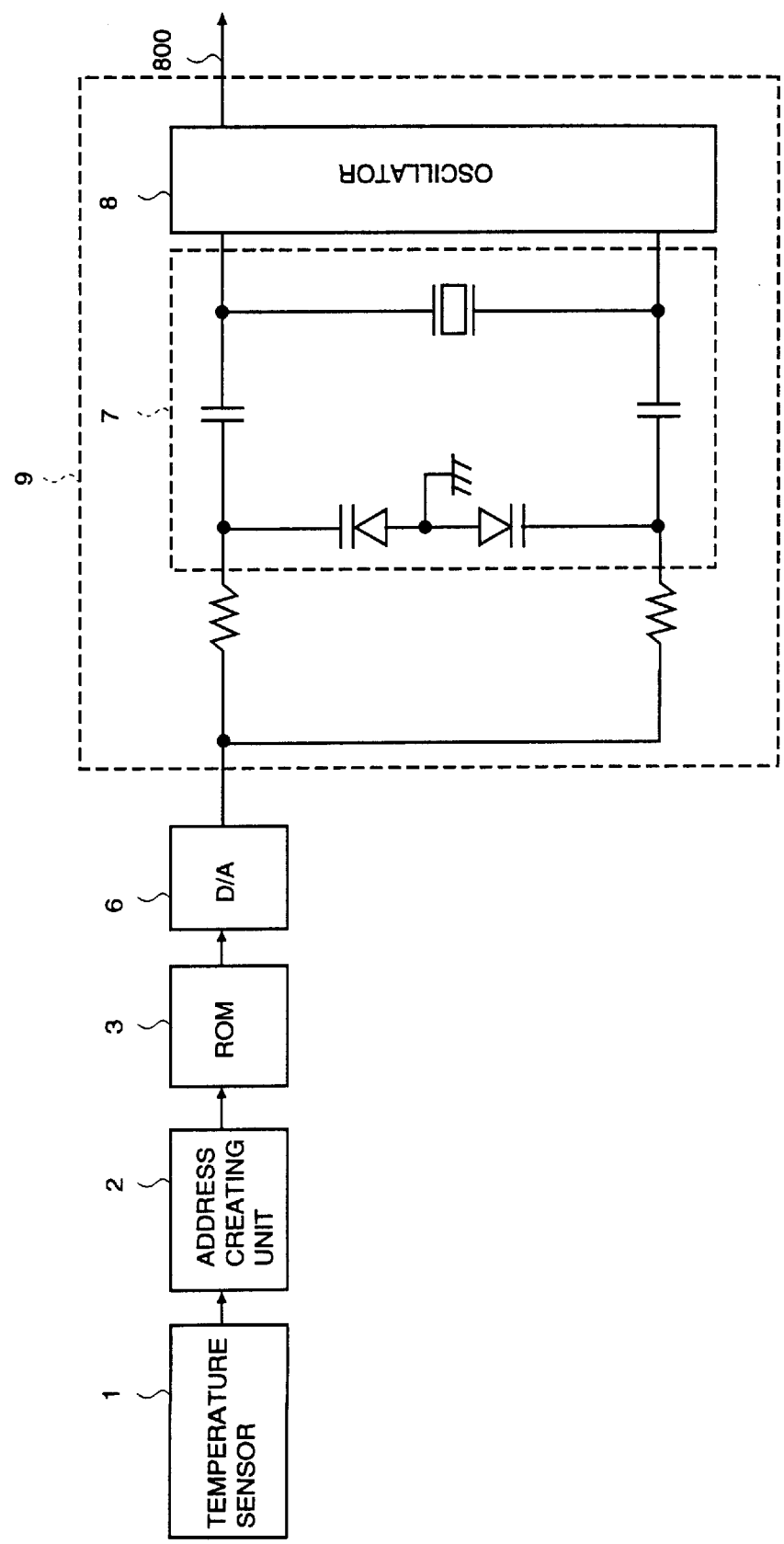
FIG. 3 is a diagram showing the configuration of a conventional temperature compensation oscillator.
Figure 4:
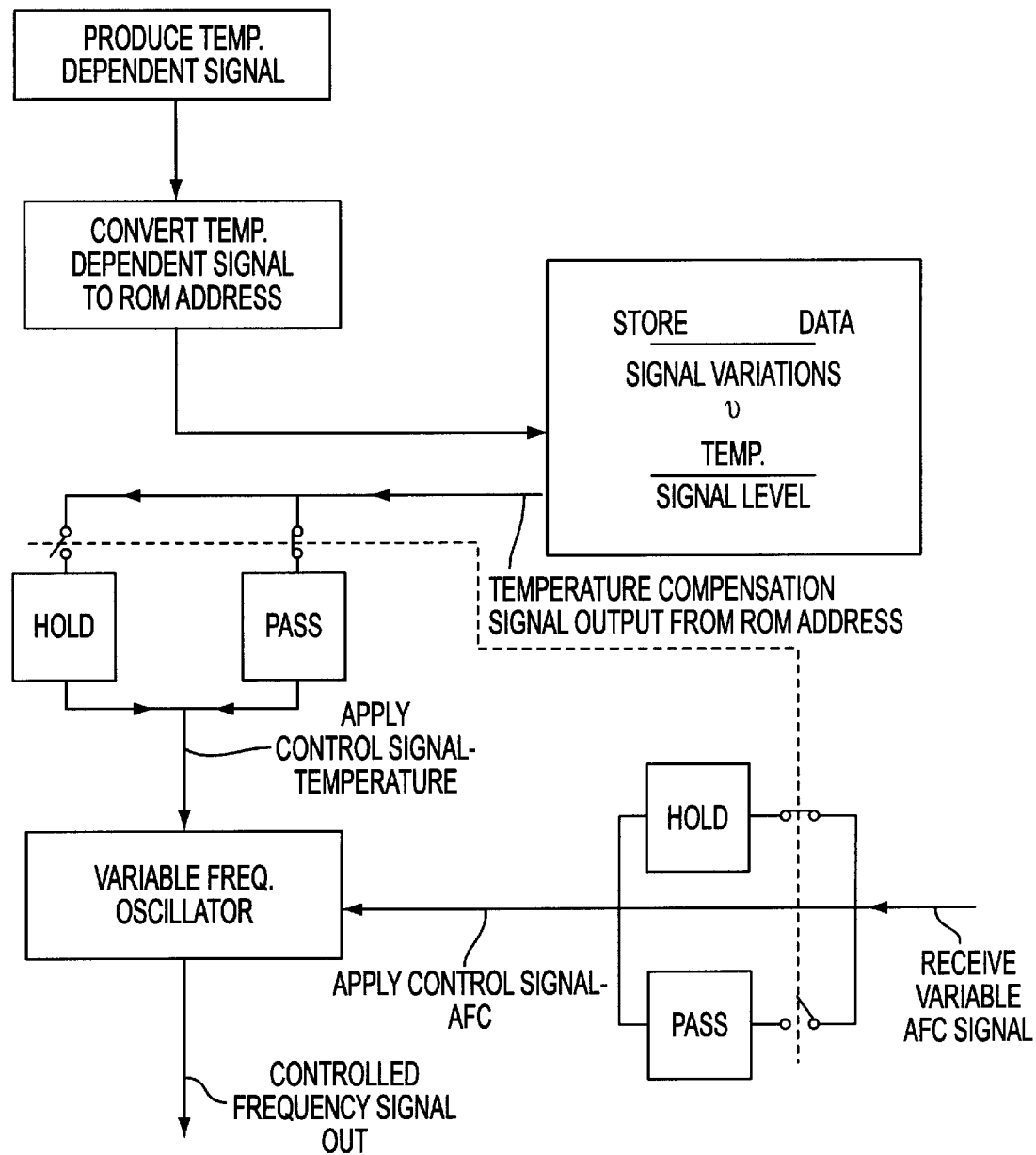
FIG. 4 is a flow diagram of the invention

In the digital temperature compensation crystal oscillator according to the present invention shown in FIG. 2, the temperature sensor 1 outputs an output signal according to ambient temperatures. The address creating unit 2 converts the output signal into the address of the ROM 3 at which temperature compensation data is stored. The ROM 3 stores frequency compensation data according to the temperature previously indicated by the temperature sensor 1 into the address created by the address creating unit 2. The latching means 41 holds or passes the output from the ROM 3 according to the latch control signal 411 and then outputs it to the adder 5. The latching means 42 is controlled by the latch control signal 421. The latching means 42 holds or passes an external digital AFC signal 420 to the adder 5. The adder 5 adds the two digital signals and then outputs the sum to the D/A converter 6. The D/A converter 6 converts the addition result into an analog signal to control the oscillation frequency of the voltage controlled crystal oscillator 9.

In the initial state after a power source is turned on, an external digital AFC signal 420 is set to a predetermined default value and then is held by the latching means 42 controlled with the latch control signal 421. The ROM 3 is address-controlled by means of the temperature sensor 1 and the address creating unit 2. The latching means 41, controlled by the latch control signal 411, passes the output from the ROM 3. The ROM 3 stores data for compensating frequency variations due to temperature changes of the voltage controlled crystal oscillator 9, with the default value of the digital AFC signal added.

The adder 5 adds the digital AFC signal held in the latching means 42 to the temperature compensation data passed through the latching means 41. The D/A converter converts the added value into an analog signal to compensate the oscillation frequency variation due to temperature changes of the voltage controlled crystal oscillator 9. This operation allows the frequency error to be minimized to the extent of the AFC operation can be performed with the receive signal.

Next, in order to establish precise frequency synchronization using the receive signal from the base station, the latching means 41 holds the output from the ROM 3 under control of the latch control signal 411. The oscillation frequency of the voltage controlled crystal oscillator 9 is adjusted by changing the external digital AFC signal 420 in synchronism with the frequency of the receive signal and making the latching means 42 controlled by the latch control signal 421 in a passing state. In the conventional approach, high precision frequency compensation under AFC becomes in vain if the ambient temperature changes after an AFC operation by the receive signal. However, the present invention can avoid the above-mentioned problem since the latching means 41 holds frequency compensation data for temperature compensation even if the ambient temperature changes after the beginning of an AFC operation by the receive signal.

Moreover, the latching means 41 holds the output from the ROM 3. The AFC operation is started by the receive signal. The value of a digital AFC signal 420 externally input in the initial state just after the power source is turned on at the next time is calculated by using the digital AFC signal 420 obtained just after the frequency error has been compensated to a necessary precision and a value (not shown) decided by the gradient of a variation in oscillation frequency of the voltage controlled oscillator 9 by the digital AFC signal 420 is compensated to the extent of a necessary precision. For example, the value b of digital AFC signal 420 obtained just when the frequency error is compensated under AFC to a necessary precision is used as the initial value or default value of the digital AFC signal 420. Thus, the influence of frequency variations due to aging can be reduced.

Conventionally, there have been the problem that ambient temperature changes during the AFC operation by the receive signal influence the compensating operation of the oscillation frequency, so that the high precision frequency compensation under the AFC by the receive signal may be in vain, as well as the problem that when the frequency varies because of aging, the frequency compensation to a temperature change with a preset compensation value causes a frequency error, so that the receiving operation cannot be performed under the worst conditions. However, as described above, the configuration of the present invention can avoid the above mentioned problems.

The entire disclosure of Japanese Patent Application No. 317544/1996 filed on Nov. 28, 1996 including specification, claims, drawing and summary are incorporated herein by reference in its entirety.

What is claimed is:

1. A digital temperature compensation oscillator in a reference frequency source used in a base station with high frequency precision and terminals for radio communications, comprising:

a temperature sensor for producing an output signal varying according to ambient temperature, an address creating unit for converting values of said output signal from said temperature sensor and creating corresponding ROM (read-only memory) addresses, a voltage-controlled crystal oscillator, a ROM for storing control voltage values at respective ROM addresses to compensate for frequency variation due to ambient temperatures of said voltage-controlled crystal oscillator, latching means for holding or passing data output from said ROM in response to an external control signal, and a D/A converter for producing a control voltage for said voltage-controlled crystal oscillator according to said data output from said ROM by way of said latching means, said voltage controlled crystal oscillator being fine adjusted by said control voltage from said D/A converter, and by an external AFC signal, said latching means holding constant said control voltage from said converter when said AFC signal is varied, said AFC signal being constant when said control voltage from said converter is variable with temperature.

2. The digital temperature compensation oscillator of claim 1, wherein the oscillation frequency of said voltage-controlled crystal oscillator is adjusted by fixing said external AFC signal to a predetermined default value in an initial state when power is turned on, compensating a variation in oscillation frequency due only to temperature changes of said voltage-controlled crystal oscillator with only the output of said D/A converter, holding the output of said ROM by means of said latching means when a precise frequency synchronization operation is performed using a receive signal from said base station while varying said external AFC signal in accordance with the frequency synchronization operation.

3. The digital temperature compensation oscillator of claim 2, wherein a signal value, determined by the value of said AFC signal just after a precise frequency synchronization operation has been executed to said base station in the previous use, is used as a default value of said AFC signal.

4. An oscillator as in claim 1, wherein said AFC signal is one of analog and digital.

5. A digital temperature compensation oscillator in a reference frequency source used in a base station with high frequency precision and terminals for radio communications, comprising:

a temperature sensor for producing an output signal varying according to ambient temperature, an address creating unit for converting values of said output signal from said temperature sensor and creating corresponding ROM (read-only memory) addresses, a voltage-controlled crystal oscillator, a ROM for storing control voltage values at respective ROM addresses to compensate frequency variation due to ambient temperatures of said voltage-controlled crystal oscillator, first latching means for holding or passing data output from said ROM in response to an external control signal, and second latching means for holding or passing an external AFC signal in response to an external control signal, an adder for adding the output of said ROM to said external AFC signal, said AFC signal being held in or passed through said second latching means, and said ROM output being held in or passed through said first latching means, a D/A converter for producing a control voltage for said voltage controlled crystal oscillator according to a sum output from said adder, said voltage controlled crystal oscillator being fine adjusted based on one control voltage output from said adder.

6. The digital temperature compensation oscillator of claim 5, wherein the oscillation frequency of said voltage-controlled crystal oscillator is adjusted by fixing only said external AFC signal to a predetermined default value in an initial state when power is turned on, adding said default value to the output of said ROM read out in accordance with ambient temperatures by means of said adder, compensating a variation in oscillation frequency due to temperature changes of said voltage-controlled crystal oscillator with only the output of said D/A converter, holding only the output of said ROM by means of said latching means when a precise frequency synchronization operation is performed using a receive signal from said base station while varying said external AFC signal in accordance with the frequency synchronization operation.

7. The digital temperature compensation oscillator of claim 6, wherein a signal value, determined by the value of said AFC signal just after a precise frequency synchronization operation has been executed to said base station in the previous use, is used as a default value of said AFC signal.

8. An oscillator as in claim 5, wherein said AFC signal is one of analog and digital.

9. A method for controlling a digital temperature compensation oscillator in a reference frequency source used in a base station with high frequency precision and terminals for radio communications, said digital temperature compensation oscillator including a ROM, latching means, and a voltage-controlled crystal oscillator, said method comprising the steps of:

producing an output signal varied according to ambient temperatures of said voltage-controlled crystal oscillator, converting values of said output signal into corresponding ROM (read-only memory) addresses, storing control voltage values into respective addresses of said ROM to compensate for frequency variation due to ambient temperatures of said voltage-controlled crystal oscillator, holding or passing by said latching means of data output from said ROM in response to an external control signal, producing a control voltage for said voltage-controlled crystal oscillator according to said data output from said ROM, and fine adjusting said voltage-controlled crystal oscillator by control voltages including said control voltage from said ROM and an external AFC signal, one of said control voltages being fixed while the other is variable.

10. The method of claim 9, wherein said fine adjusting step comprises the steps of:

fixing said external AFC signal to a predetermined default value in an initial state when power is turned on, compensating a variation in oscillation frequency due to temperature changes of said voltage-controlled crystal oscillator with only the output of said ROM, holding the output of the ROM by means of said latching means when a precision frequency synchronization operation is performed using a receive signal from the base station, and varying said external AFC signal in accordance with the frequency synchronization operation.

11. An oscillator as in claim 9, wherein said AFC signal is one of analog and digital.

12. A method for controlling a digital temperature compensation oscillator in a reference frequency source used in a base station with high frequency precision and terminals for radio communications, said digital temperature compensation oscillator including a ROM, latching means, an adder, and a voltage-controlled crystal oscillator, said method comprising the steps of:

producing an output signal varied according to ambient temperatures of said voltage-controlled crystal oscillator, converting values of said output signal into a corresponding ROM (read-only memory) address, storing control voltage values in respective addresses of said ROM to compensate for frequency variation due to ambient temperatures of said voltage-controlled crystal oscillator, holding or passing by said latching means of data output from said ROM in response to a first external control signal, and holding or passing an external AFC signal in response to a second external control signal, adding the output of said ROM to said AFC signal, producing a control voltage for said voltage con trolled crystal oscillator according to an output obtained in said adding step, fine adjusting said voltage controlled crystal oscillator based on said control voltage, and maintaining one of said ROM output and said AFC signal fixed in value while the other is variable.

13. An oscillator as in claim 12, wherein said AFC signal is one of analog and digital.

* * * * *